United States Patent
Camacho et al.

(10) Patent No.: US 8,304,921 B2
(45) Date of Patent: Nov. 6, 2012

(54) INTEGRATED CIRCUIT PACKAGING SYSTEM WITH INTERCONNECT AND METHOD OF MANUFACTURE THEREOF

(75) Inventors: Zigmund Ramirez Camacho, Singapore (SG); Henry Descalzo Bathan, Singapore (SG); Allan P. Ilagan, Singapore (SG); Philip Lyndon Cablao, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/618,417

(22) Filed: Nov. 13, 2009

(65) Prior Publication Data

US 2011/0115065 A1    May 19, 2011

(51) Int. Cl.
H01L 23/48 (2006.01)
H01L 23/52 (2006.01)
H01L 29/30 (2006.01)
(52) U.S. Cl. .......... 257/786; 257/698; 438/125
(58) Field of Classification Search .......... 257/784, 257/701, 786, 666, 698; 438/123, 125
See application file for complete search history.

(56) References Cited

U.S. PATENT DOCUMENTS

| | | | |
|---|---|---|---|
| 6,177,726 B1 | 1/2001 | Manteghi | |
| 6,573,121 B2 | 6/2003 | Yoneda et al. | |
| 6,635,957 B2 | 10/2003 | Kwan et al. | |
| 6,770,959 B2 | 8/2004 | Huang et al. | |
| 6,774,449 B1 | 8/2004 | Nishii et al. | |
| 6,956,286 B2 * | 10/2005 | Kuzawinski et al. | 257/700 |
| 6,979,897 B2 * | 12/2005 | Ma | 257/691 |
| 7,102,214 B1 | 9/2006 | Miks et al. | |
| 7,307,352 B2 * | 12/2007 | Choi | 257/786 |
| 7,327,043 B2 * | 2/2008 | Chia et al. | 257/786 |
| 7,399,658 B2 | 7/2008 | Shim et al. | |
| 7,429,786 B2 * | 9/2008 | Karnezos et al. | 257/686 |
| 7,494,847 B2 * | 2/2009 | Karnezos et al. | 438/109 |
| 2008/0135997 A1 | 6/2008 | Lee et al. | |
| 2009/0152547 A1 | 6/2009 | Park et al. | |
| 2009/0243077 A1 | 10/2009 | Chow et al. | |

* cited by examiner

*Primary Examiner* — S. V Clark
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a planar support structure having a cavity; forming a terminal within the cavity with the terminal coplanar with the planar support structure; forming a conductive pathway on the terminal and the planar support structure with the conductive pathway having a route portion and an interconnect attach portion at the end of the route portion; connecting a device and the interconnect attach portion with the interconnect attach portion towards the device; and forming an encapsulation over the planar support structure covering the conductive pathway and the device.

20 Claims, 4 Drawing Sheets

US 8,304,921 B2

INTEGRATED CIRCUIT PACKAGING SYSTEM WITH INTERCONNECT AND METHOD OF MANUFACTURE THEREOF

TECHNICAL FIELD

The present invention relates generally to an integrated circuit packaging system, and more particularly to a system for an integrated circuit packaging system with interconnect.

BACKGROUND ART

Modern electronics, such as smart phones, cell phones, digital cameras, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance. Different challenges arise from increased functionality integration and miniaturization.

Thus, a need still remains for an integrated circuit packaging system including high input/output density, low cost, and improved reliability. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a planar support structure having a cavity; forming a terminal within the cavity with the terminal coplanar with the planar support structure; forming a conductive pathway on the terminal and the planar support structure with the conductive pathway having a route portion and an interconnect attach portion at the end of the route portion; connecting a device and the interconnect attach portion with the interconnect attach portion towards the device; and forming an encapsulation over the planar support structure covering the conductive pathway and the device.

The present invention provides an integrated circuit packaging system, including: a planar support structure having a cavity; a terminal within the cavity and coplanar with the planar support structure; a conductive pathway on the terminal and the planar support structure with the conductive pathway having a route portion and an interconnect attach portion at the end of the route portion; a device connected to the interconnect attach portion with the interconnect attach portion towards the device; and an encapsulation over the planar support structure covering the conductive pathway and the device.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
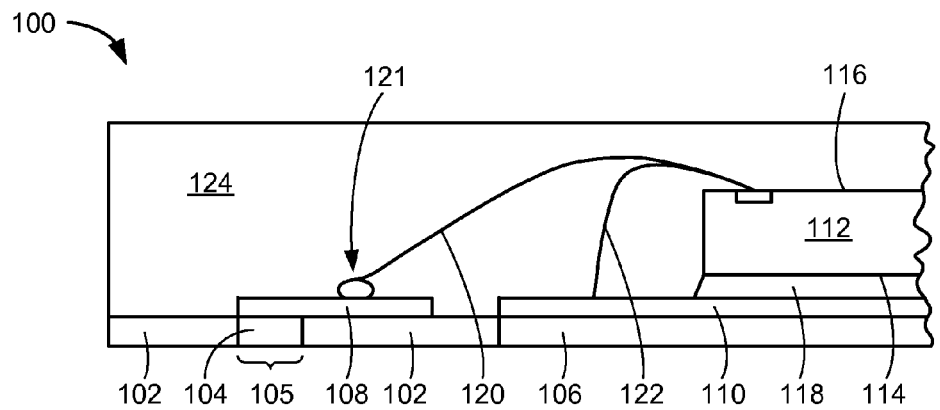
FIG. 1 is a cross-sectional view of a portion of an integrated circuit packaging system along a section line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 2:
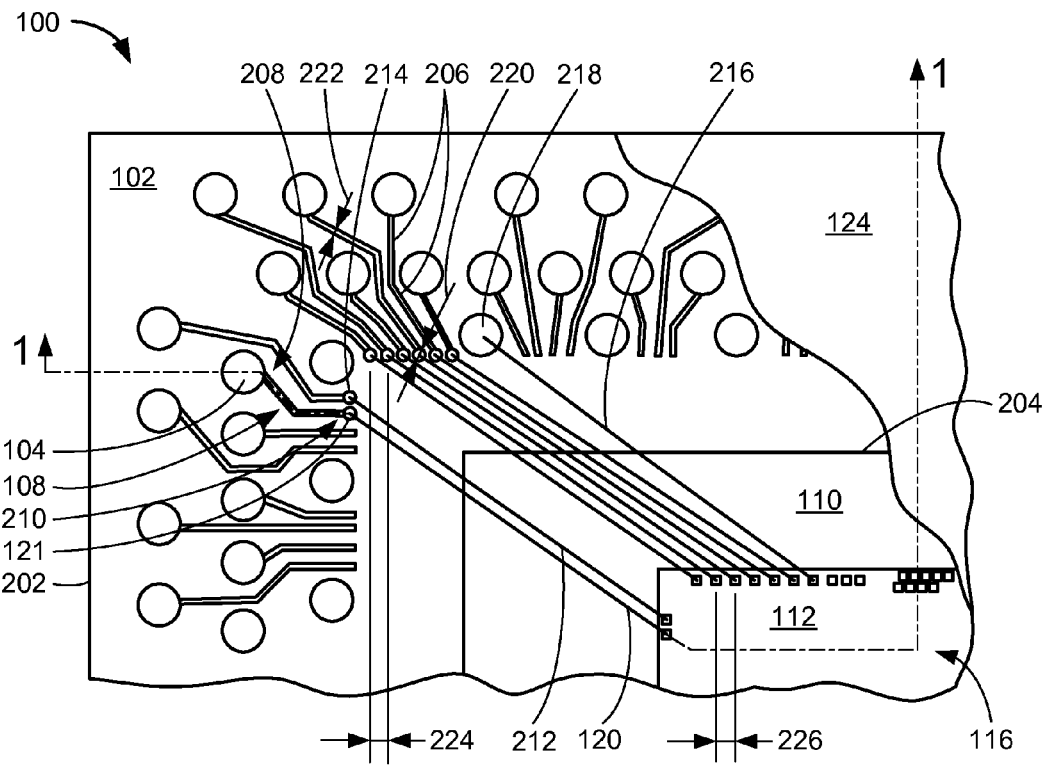
FIG. 2 is a top view of the portion of the integrated circuit packaging system.

Referring now to FIG. 1, therein is shown a cross-sectional view of a portion of an integrated circuit packaging system 100 along a section line 1-1 of FIG. 2 in an embodiment of the present invention. The integrated circuit packaging system 100 can represent a configuration of a packaging system, which can include a multi-row quad flat no-lead (QFN) with pre-plated leadframe (PPF) build-up leads package, an ultra-thin quad flat no-lead saw singulated strip etch (UQFNs-se) package, or a plated pad package that is configured for high-density bonding.

The integrated circuit packaging system 100 can include a planar support structure 102, such as a structure that includes polyimide (PI), a solder resist, an epoxy resin, or a permanent plastic mask. The integrated circuit packaging system 100 can include a terminal 104, such as a pad, a lead, a plated pad, or a plated lead, adjacent the planar support structure 102 and within a hole 105 of the planar support structure 102. The terminal 104 can provide connectivity to external systems (not shown).

The integrated circuit packaging system 100 can include a paddle 106, such as a die-attach paddle (DAP), a die-attach pad, or a die pad, formed adjacent the terminal 104 with the planar support structure 102 in between. The planar support structure 102 can function as an insulator between the terminal 104 and another of the terminal 104 as well as between the terminal 104 and the paddle 106. The paddle 106 can be substantially coplanar with the planar support structure 102 and the terminal 104. Bottom sides of the planar support structure 102, the terminal 104, and the paddle 106 can be coplanar with each other.

The integrated circuit packaging system 100 can include a conductive pathway 108, such as a trace, a plated trace, a signal trace, a wire trace, a line, or a wire. The conductive pathway 108 allows for electricity to pass from an element to another element.

The conductive pathway 108 can be formed over or on the planar support structure 102 and on the terminal 104. The terminal 104 attached to the conductive pathway 108 locks in the terminal 104. The conductive pathway 108 functions as an anchor to the terminal 104. The conductive pathway 108 can inwardly extend from the terminal 104 towards the paddle 106 at an interior of the integrated circuit packaging system 100.

It has been discovered that the present invention provides the integrated circuit packaging system 100 with improved reliability. The physical attachment of the conductive pathway 108 allows the conductive pathway 108 to keep the terminal 104 in place. The conductive pathway 108 is anchored over the planar support structure 102 such that the terminal 104 cannot slip or fall out of the integrated circuit packaging system 100 thereby improving the reliability.

The integrated circuit packaging system 100 can include a conductive pad 110, which can include a conductive material for attaching an interconnect thereto, adjacent the conductive pathway 108. The conductive pad 110 can be formed over or on the paddle 106.

The integrated circuit packaging system 100 can include a device 112, such as an integrated circuit die or a wirebond integrated circuit. The device 112 can include a device inactive side 114, such as a backside, and a device active side 116 having active circuitry thereon at an opposing side to the device inactive side 114.

The integrated circuit packaging system 100 can include an attach layer 118, such as a die attach adhesive, an adhesive film, or a thermal conductive epoxy. The device 112 can be attached to or mounted over the conductive pad 110 with the attach layer 118. The attach layer 118 can be attached to the device inactive side 114. The attach layer 118 can be provided with thermally conductive capabilities.

The integrated circuit packaging system 100 can include a device-pathway interconnect 120, such as a bond wire or a conductive wire, connected to the conductive pathway 108 and the device 112. The device-pathway interconnect 120 can be attached to the device active side 116.

For illustrative purposes, the device-pathway interconnect 120 is shown attached in the middle of the top surface of the conductive pathway 108, although it is understood that the device-pathway interconnect 120 can be attached at a different portion of the conductive pathway 108. For example, the device-pathway interconnect 120 can be attached at an end portion of the conductive pathway 108 that is closest to the paddle 106 or the terminal 104. The device-pathway interconnect 120 can include a connect portion 121, such as a wire bump or wire stitch of a wire bond, that is attached or connected to the conductive pathway 108.

The integrated circuit packaging system 100 can include a device-pad interconnect 122, such as a bond wire or a conductive wire, connected to the conductive pad 110 and the device 112. The device-pad interconnect 122 can be attached to the device active side 116. For example, the device-pad interconnect 122 can function as a ground wire for the device 112, with the conductive pad 110, the paddle 106, or a combination thereof, functioning as a ground plane.

For illustrative purposes, the cross-sectional view depicts the conductive pad 110, although it is understood that the conductive pad 110 can be optionally formed. For example, the device 112 is attached over the paddle 106 with the attach layer 118, and the device-pad interconnect 122 is attached to the device 112 and the paddle 106.

The integrated circuit packaging system 100 can include an encapsulation 124, such as a cover including an epoxy molding compound, an encapsulation material, or a molding material. The encapsulation 124 can be formed over the planar support structure 102, the terminal 104, and the paddle 106. The encapsulation 124 can be formed to cover the conductive pathway 108, the conductive pad 110, the device 112, the device-pathway interconnect 120, and the device-pad interconnect 122. The encapsulation 124 exposes the terminal 104 and the paddle 106.

It has also been discovered that the present invention provides increased reliability, increased yield, and lower cost design. The device-pathway interconnect 120 can have a reduced wire span by attaching or routing the conductive pathway 108 to the terminal 104 that is adjacent the planar support structure 102 and attaching the device-pathway interconnect 120 to the conductive pathway 108. Designs having reduced wire spans have a simplified wirebonding layout compared to conventional packages with very long wire span and complicated wirebonding layout resulting in increased reliability, increased yield, and lower cost.

Referring now to FIG. 2, therein is shown a top view of the portion of the integrated circuit packaging system 100. The top view is shown without a portion of the encapsulation 124 for clarity.

The integrated circuit packaging system 100 can include the terminal 104 formed in multiple peripheral rows. The terminal 104 can be formed adjacent or along a periphery 202 of the integrated circuit packaging system 100.

The terminal 104 can be formed around a perimeter 204 of the conductive pad 110. The terminal 104 can be isolated from another of the terminal 104 with the planar support structure 102 in between.

The conductive pathway 108 can be formed having any number of route portions 206, each of which includes a linear portion of the conductive pathway 108. The route portions 206 can preferably be formed of a common material having characteristics being formed from a single integral structure.

One of the route portions 206 can be formed adjoined another of the route portions 206 at a predetermined angle to the one of the route portions 206. The predetermined angle can depend on design guidelines or geometry constraints, as examples. The predetermined angle help separate the distance between the array of the terminal 104 for improved connection to the next system level (not shown).

The integrated circuit packaging system 100 can include the route portions 206 of the conductive pathway 108 formed adjacent another of the terminal 104, another of the conductive pathway 108, or a combination thereof. The conductive pathway 108 can include a predetermined width that can be less than a predetermined diameter of a planar surface of the terminal 104 having a cylindrical structure, for example.

The conductive pathway 108 includes a terminal attach portion 208, which is a section at an end of the conductive pathway 108 that is attached or connected to the terminal 104. The terminal attach portion 208 can be formed on the terminal 104. The conductive pathway 108 includes an interconnect attach portion 210, which is a section at another end of the conductive pathway 108 that is attached or connected to the device-pathway interconnect 120.

The conductive pathway 108 can be formed having the terminal attach portion 208 at one end and the interconnect attach portion 210 at the other end. The connect portion 121 of the device-pathway interconnect 120 is attached to the interconnect attach portion 210. The top view is shown without all of the conductive pathway 108 connected to the device 112 for clarity.

The interconnect attach portion 210 can be towards the paddle 106 or the device 112. The terminal attach portion 208 and the interconnect attach portion 210 are at opposite ends of the route portions 206 of the conductive pathway 108.

The interconnect attach portion 210 can be substantially peripherally aligned with another of the interconnect attach portion 210 of another of the conductive pathway 108. The term "peripherally aligned" means along a line substantially parallel to an edge of the integrated circuit packaging system 100, the paddle 106, the conductive pad 110, the device 112, or a combination thereof.

The integrated circuit packaging system 100 can include a further device-pathway interconnect 212, which is another of the device-pathway interconnect 120. The further device-pathway interconnect 212 can be attached or connected to the device 112 and another of the conductive pathway 108 that is different than the conductive pathway 108 connected to the device-pathway interconnect 120. The further device-pathway interconnect 212 can include a further connect portion 214 that is attached or connected to the another of the conductive pathway 108.

The integrated circuit packaging system 100 can include a device-terminal interconnect 216, such as a bond wire or a conductive wire, attached or connected to a further terminal 218 and the device 112. The further terminal 218 is different than the terminal 104 and not attached to the conductive pathway 108. The further terminal 218 can be adjacent or closer to the device 112 than the terminal 104 that is attached to the conductive pathway 108. For example, the further terminal 218 is between to the device 112 and the terminal 104. The device-terminal interconnect 216 can be attached to the device active side 116.

The further terminal 218 can be adjacent the connect portion 121 or the further connect portion 214. For illustrative purposes, the top view is shown with the further terminal 218 adjacent yet another of the connect portion 121.

The connect portion 121 includes an attach width 220 that is greater than a route width 222 of the route portions 206 to give more area to attach resulting in use of lower precision wire bonding equipments, increased yield, increased reliability, and lower cost. The connect portion 121 can be inline with the further connect portion 214. In other words, the connect portion 121 and the further connect portion 214 are formed along a geometric line. The geometric line can be substantially parallel to the periphery 202 or an edge of the device 112.

The connect portion 121 and the further connect portion 214 can also be formed inside at least one row of the terminal 104. In other words, the connect portion 121 and the further connect portion 214 are internal to and from an edge of the integrated circuit packaging system 100 and between at least one row of the terminal 104 and the device 112.

The terminal 104 can be inline with another of the terminal 104. In other words, the terminal 104 and the another of the terminal 104 are along a geometric line.

The connect portion 121 can be formed with a spacing 224 from the further connect portion 214. The spacing 224 can be substantially the same as a pad pitch 226 of the device 112, resulting in the further device-pathway interconnect 212 formed substantially parallel with the device-pathway interconnect 120. The pad pitch 226 is defined as a distance between a center of a pad of the device 112 to that of another pad of the device 112.

It has been discovered that the present invention provides the integrated circuit packaging system 100 with increased yield, increased reliability, and lower cost. The connect portion 121 has the attach width 220 that is larger than the route width 222 of the route portions 206 to give more surface area to attach. This provides the option to use lower precision wire bonding equipments, increased yield, increased reliability, and lower cost.

It has also been discovered that the present invention provides an effective method that supports a packaging system with high input/output (I/O) density. The device 112 is connected to the terminal 104 with the device-pathway interconnect 120 attached to the conductive pathway 108 at the interconnect attach portion 210 and the conductive pathway 108 attached to the terminal 104 at the terminal attach portion 208. As such, the present invention supports high I/O density particularly with the terminal 104 formed in multiple rows along the periphery 202 of the integrated circuit packaging system 100.

It has further been discovered that the present invention provides improved reliability. With the conductive pathway 108 having the interconnect attach portion 210 adjacent the paddle 106 or the device 112, the integrated circuit packaging system 100 can reduce wire crossing by shortening the wire length of the device-pathway interconnect 120, thereby reducing wirebond process instability and high risk of wire short during transfer molding.

Figure 3:
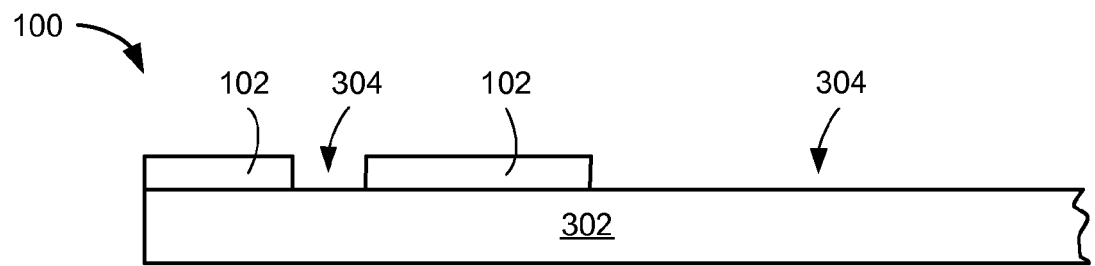
FIG. 3 is a cross-sectional view of the portion of the integrated circuit packaging system along the section line 1-1 of FIG. 2 in an assembly process of a forming phase of the planar support structure.

Referring now to FIG. 3, therein is shown a cross-sectional view of the portion of the integrated circuit packaging system 100 along the section line 1-1 of FIG. 2 in an assembly process of a forming phase of the planar support structure 102. The cross-sectional view depicts a sacrificial layer 302, which can include a solid copper sheet, a copper strip, a lead frame, or a copper leadframe that is etched, stamped, cut, or a combination thereof.

The planar support structure 102 can be formed over the sacrificial layer 302. The planar support structure 102 can include a cavity 304, exposing a portion of a top surface of the sacrificial layer 302 therein. The cavity 304 can differ in shape and sizes.

The planar support structure 102 can be formed by a number of processes. For example, the planar support structure 102 can be formed with a photo-resist and patterning to form the cavity 304 in the planar support structure 102.

Figure 4:
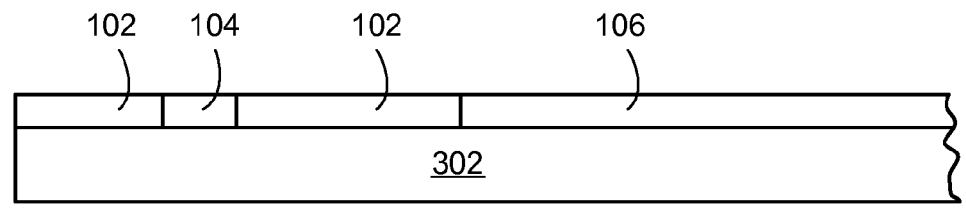
FIG. 4 is a cross-sectional view of the structure of FIG. 3 in a forming phase of the terminal and the paddle.

Referring now to FIG. 4, therein is shown a cross-sectional view of the structure of FIG. 3 in a forming phase of the terminal 104 and the paddle 106. The terminal 104 and the paddle 106 can be formed in or within the cavity 304 of FIG. 3. The terminal 104 and the paddle 106 can be formed over the sacrificial layer 302 and adjacent the planar support structure 102.

The terminal 104 and the paddle 106 can be formed in a number of ways. For example, the terminal 104 and the paddle 106 can be plated with copper (Cu), nickel (Ni), palladium (Pd), gold (Au), any other conductive material, nickel-palladium-gold (Ni—Pd—Au), or any combination thereof.

Figure 5:
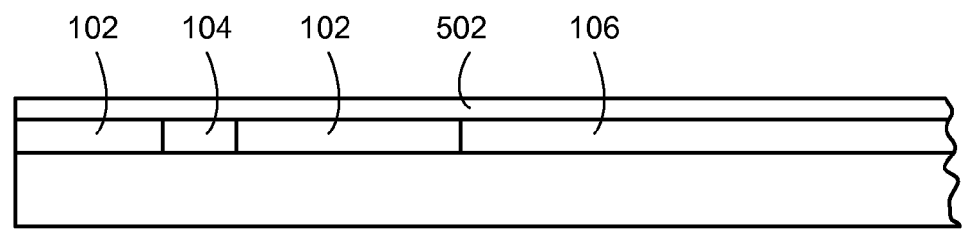
FIG. 5 is a cross-sectional view of the structure of FIG. 4 in a forming phase of a conductive layer.

Referring now to FIG. 5, therein is shown a cross-sectional view of the structure of FIG. 4 in a forming phase of a conductive layer 502. The conductive layer 502 can preferably include copper, a metal, or any other conductive material. The conductive layer 502 can be formed or deposited over or on the planar support structure 102, the terminal 104, and the paddle 106.

The conductive layer 502 can be formed with a sputtering process (e.g. a copper sputter or a sputtering deposition method) or a cladding process (e.g. a copper cladding). The conductive layer 502 can be formed to bond or attach to the planar support structure 102, the terminal 104, and the paddle 106 without adhesives or filler materials.

Figure 6:
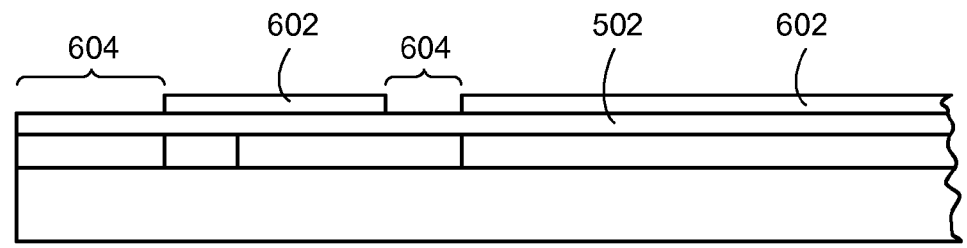
FIG. 6 is a cross-sectional view of the structure of FIG. 5 in an attaching phase of a positive mask.

Referring now to FIG. 6, therein is shown a cross-sectional view of the structure of FIG. 5 in an attaching phase of a positive mask 602. The positive mask 602 can include a resist mask, a positive resist mask, or a mask resistant to an etching treatment.

The positive mask 602 can be substantially unaffected by an etching process, protecting a portion of the conductive layer 502 during the etching process. The positive mask 602 can be attached to or on the portion of the conductive layer 502. The cross-sectional view depicts an etch region 604, where the positive mask 602 exposes a portion of the conductive layer 502 that is to be etched or removed.

Figure 7:
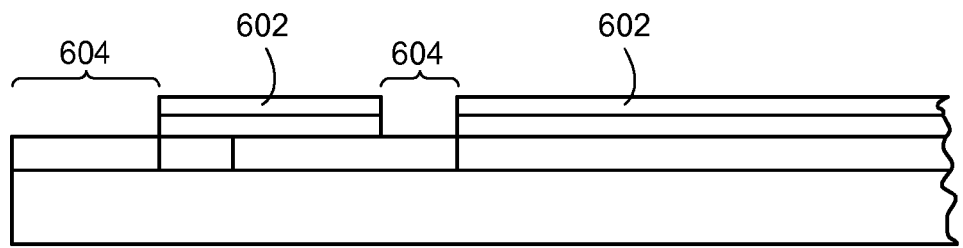
FIG. 7 is a cross-sectional view of the structure of FIG. 6 in a removing phase of a portion of the conductive layer of FIG. 5.

Referring now to FIG. 7, therein is shown a cross-sectional view of the structure of FIG. 6 in a removing phase of a portion of the conductive layer 502 of FIG. 5. The portion of the conductive layer 502 that is exposed in the etch region 604 can be etched away or removed.

The portion of the conductive layer 502 is not covered by the positive mask 602. The etching or the removal of the portion of the conductive layer 502 can include a subtractive etching process or any other fabrication process that is used to form metal patterns. The removal portion of the conductive layer 502 forms the conductive pathway 108 below the positive mask 602 and exposes the planar support structure 102.

The conductive pathway 108 can include characteristics of the portion of the conductive layer 502 removed. The characteristics can include an etched surface or other removal tool marks.

For illustrative purposes, the formation of the conductive pathway 108 is described with the patterning with the positive mask 602, although it is understood that the conductive pathway 108 can be formed in other ways. For example, a negative mask could be used in place of the positive mask 602 to form the etch region 604.

Figure 8:
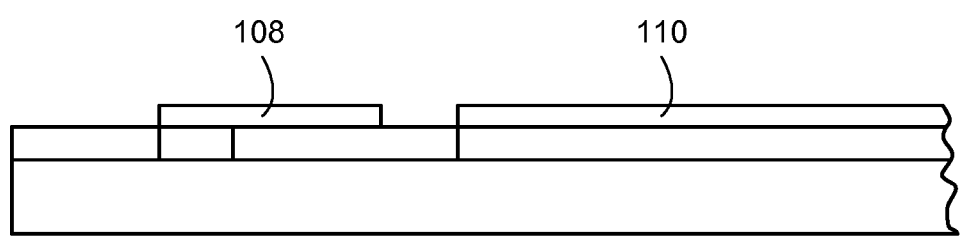
FIG. 8 is a cross-sectional view of the structure of FIG. 7 in a removing phase of the positive mask of FIG. 6.

Referring now to FIG. 8, therein is shown a cross-sectional view of the structure of FIG. 7 in a removing phase of the positive mask 602 of FIG. 6. The positive mask 602 can be removed or stripped exposing the conductive pathway 108 and the conductive pad 110. The conductive pathway 108 or the conductive pad 110 can be plated with copper (Cu), any other conductive material, nickel-palladium (Ni—Pd), or any combination thereof.

The conductive pathway 108 and the conductive pad 110 can include characteristics of the positive mask 602 removed. The characteristics can include a stripped surface or other removal tool marks.

Figure 9:
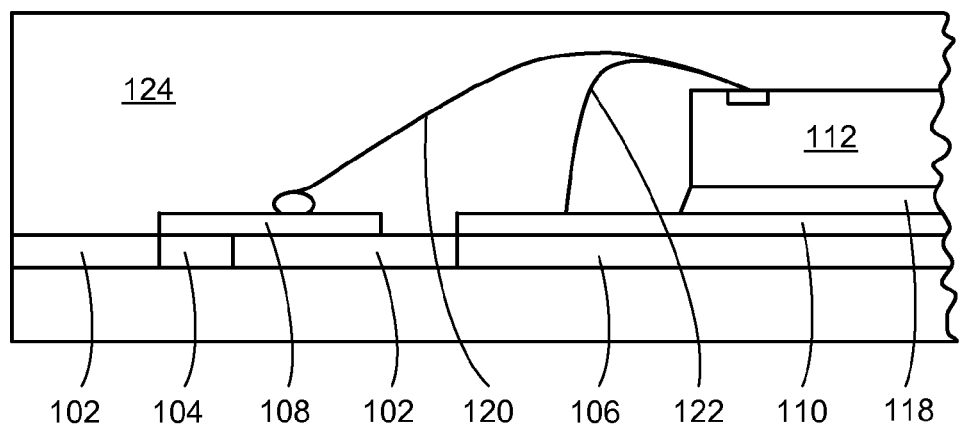
FIG. 9 is a cross-sectional view of the structure of FIG. 8 in an attaching phase of the device.

Referring now to FIG. 9, therein is shown a cross-sectional view of the structure of FIG. 8 in an attaching phase of the device 112. The device 112 can be mounted over the conductive pad 110 with the attach layer 118.

The device-pathway interconnect 120 and the device-pad interconnect 122 can be attached to the device 112 and the conductive pathway 108 and the conductive pad 110, respectively. The encapsulation 124 can be formed over the planar support structure 102, the terminal 104, the paddle 106, the conductive pathway 108, the conductive pad 110, the device 112, the device-pathway interconnect 120, and the device-pad interconnect 122.

The device-pathway interconnect 120 and the device-pad interconnect 122 can be attached with any interconnect techniques. For example, the interconnect techniques can include a wire bonding, a ball bonding, a wedge bonding, or a thermosonic bonding.

Figure 10:
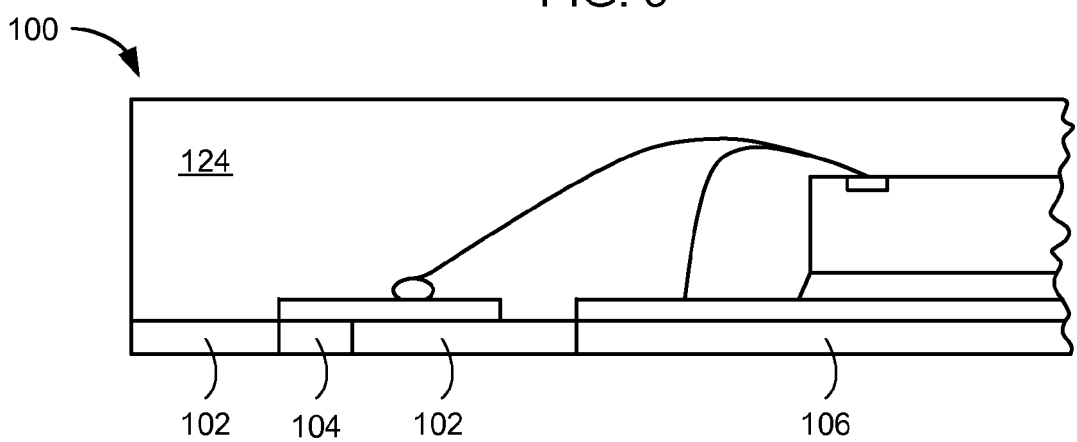
FIG. 10 is a cross-sectional view of the structure of FIG. 9 in a removing phase of the sacrificial layer of FIG. 3.

Referring now to FIG. 10, therein is shown a cross-sectional view of the structure of FIG. 9 in a removing phase of the sacrificial layer 302 of FIG. 3. The sacrificial layer 302 can be removed by etching, grinding, sanding, or any other mechanical or chemical means.

The planar support structure 102, the terminal 104, and the paddle 106 can be partially exposed from the encapsulation 124 at a bottom surface of the integrated circuit packaging system 100. The planar support structure 102 can be substantially coplanar with the terminal 104 and the paddle 106.

The planar support structure 102, the terminal 104, and the paddle 106 can include characteristics of the sacrificial layer 302 removed. The characteristics can include an etched surface, grinding marks, sanding marks, other removal tool marks, chemical residue, or a chemically processed surface.

Figure 11:
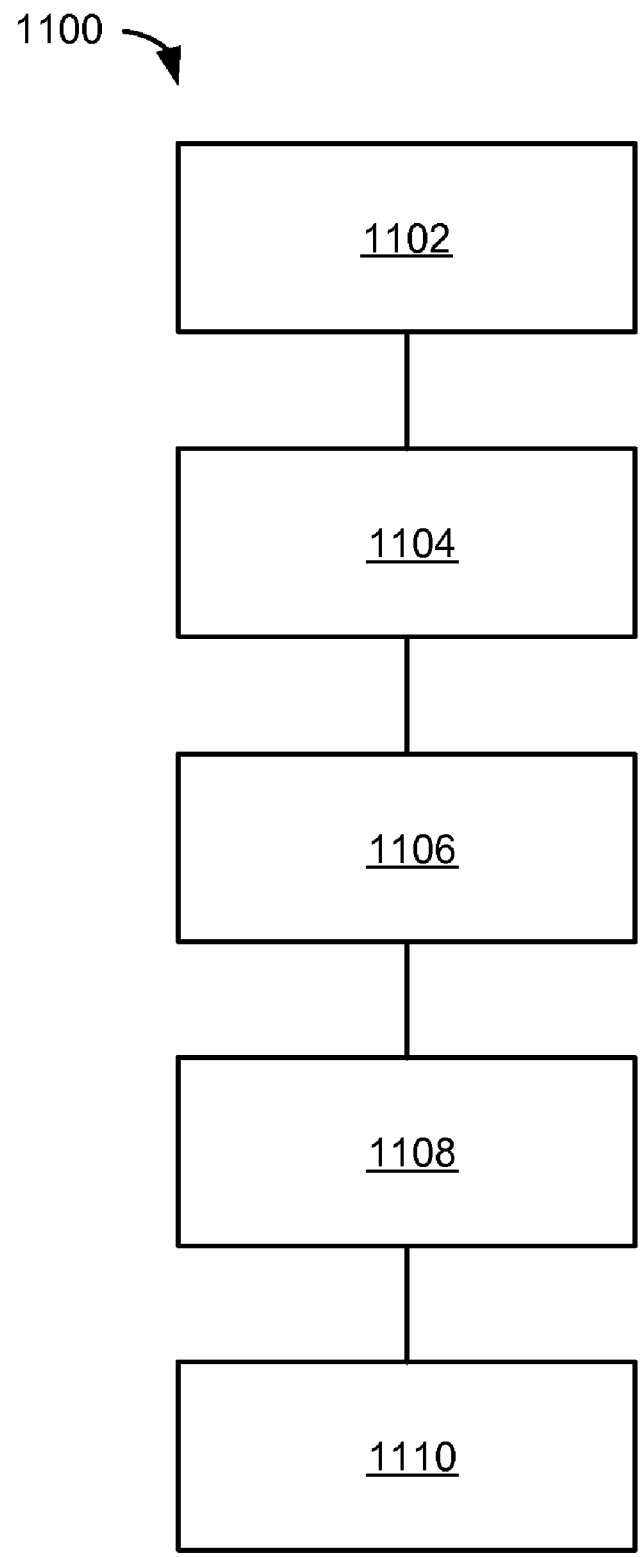
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: providing a planar support structure having a cavity in a block 1102; forming a terminal within the cavity with the terminal coplanar with the planar support structure in a block 1104; forming a conductive pathway on the terminal and the planar support structure with the conductive pathway having a route portion and an interconnect attach portion at the end of the route portion in a block 1106; connecting a device and the interconnect attach portion with the interconnect attach portion towards the device in a block 1108; and forming an encapsulation over the planar support structure covering the conductive pathway and the device in a block 1110.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a planar support structure having a cavity;
   forming a terminal within the cavity with the terminal having a bottom side coplanar with a bottom side of the planar support structure;
   forming a conductive pathway, on the planar support structure, anchored over and connected to the terminal locking the terminal in the cavity, the conductive pathway having a route portion and an interconnect attach portion at the end of the route portion;
   connecting a device and the interconnect attach portion with the interconnect attach portion towards the device; and
   forming an encapsulation over the planar support structure covering the conductive pathway and the device leaving the bottom side of the planar support structure and the terminal exposed for connecting to an external system.

2. The method as claimed in claim 1 wherein:
   forming the conductive pathway includes forming the route portion having a route width; and
   connecting the device and the interconnect attach portion includes attaching a device-pathway interconnect, having a connect portion, to the device and the interconnect attach portion with the connect portion having an attach width greater than the route width.

3. The method as claimed in claim 1 wherein:
   connecting the device and the interconnect attach portion includes attaching a device-pathway interconnect, having a connect portion, to the device and the interconnect attach portion; and
further comprising:
   attaching a further device-pathway interconnect, having a further connect portion, to the device and another of the conductive pathway with the further connect portion inline with the connect portion.

4. The method as claimed in claim 1 further comprising connecting a further terminal and the device with the further terminal not attached to the conductive pathway.

5. The method as claimed in claim 1 wherein:
   connecting the device and the interconnect attach portion includes attaching a device-pathway interconnect, having a connect portion, to the device and the interconnect attach portion; and
further comprising:
   attaching a further device-pathway interconnect, having a further connect portion, to the device and another of the conductive pathway with the further connect portion a spacing from the connect portion and the spacing substantially the same as the connections to the device.

6. A method of manufacture of an integrated circuit packaging system comprising:
   providing a planar support structure having a cavity;
   forming a terminal within the cavity with the terminal having a bottom side coplanar with a bottom side of the planar support structure;
   forming a paddle adjacent the terminal;
   forming a conductive pathway, on the planar support structure, anchored over and connected to the terminal locking the terminal in the cavity, the conductive pathway having a route portion and an interconnect attach portion at the end of the route portion;
   connecting a device and the interconnect attach portion with the interconnect attach portion towards the device; and
   forming an encapsulation over the planar support structure covering the conductive pathway and the device leaving the bottom side of the planar support structure and terminal exposed for connecting to an external system.

7. The method as claimed in claim 6 wherein:
   forming the conductive pathway includes forming a plated trace having a route width; and
   connecting the device and the interconnect attach portion includes attaching a device-pathway interconnect, having a connect portion, to the device and the interconnect attach portion with the connect portion having an attach width greater than the route width.

8. The method as claimed in claim 6 wherein:
   connecting the device and the interconnect attach portion includes attaching a device-pathway interconnect, having a connect portion, to the device and the interconnect attach portion; and
further comprising:
   attaching a further device-pathway interconnect, having a further connect portion, to the device and another of the conductive pathway with the further connect portion inline with the connect portion and inside at least one row of the terminal.

9. The method as claimed in claim 6 further comprising connecting a further terminal and the device with the further terminal not attached to the conductive pathway and between the device and the terminal.

10. The method as claimed in claim 6 wherein:
connecting the device and the interconnect attach portion includes attaching a device-pathway interconnect, having a connect portion, to the device and the interconnect attach portion; and
further comprising:
attaching a further device-pathway interconnect, having a further connect portion, to the device and another of the conductive pathway with the device-pathway interconnect substantially parallel to the further device-pathway interconnect.

11. An integrated circuit packaging system comprising:
a planar support structure having a cavity;
a terminal within the cavity and having a bottom side coplanar with a bottom side of the planar support structure;
a conductive pathway, on the planar support structure, anchored over and connected to the terminal locking the terminal in the cavity, the conductive pathway having a route portion and an interconnect attach portion at the end of the route portion;
a device connected to the interconnect attach portion with the interconnect attach portion towards the device; and
an encapsulation over the planar support structure covering the conductive pathway and the device leaving the bottom side of the planar support structure and the terminal exposed for connecting to an external system.

12. The system as claimed in claim 11 wherein:
the conductive pathway includes the route portion having a route width; and
further comprising:
a device-pathway interconnect, having a connect portion, attached to the device and the interconnect attach portion with the connect portion having an attach width greater than the route width.

13. The system as claimed in claim 11 further comprising:
a device-pathway interconnect, having a connect portion, attached to the device and the interconnect attach portion; and
a further device-pathway interconnect, having a further connect portion, attached to the device and another of the conductive pathway with the further connect portion inline with the connect portion.

14. The system as claimed in claim 11 further comprising a further terminal connected to the device with the further terminal not attached to the conductive pathway.

15. The system as claimed in claim 11 further comprising:
a device-pathway interconnect, having a connect portion, attached to the device and the interconnect attach portion; and
a further device-pathway interconnect, having a further connect portion, attached to the device and another of the conductive pathway with the further connect portion a spacing from the connect portion and the spacing substantially the same as the connections to the device.

16. The system as claimed in claim 11 further comprising a paddle adjacent the terminal.

17. The system as claimed in claim 16 wherein:
the conductive pathway includes a plated trace having a route width; and
further comprising:
a device-pathway interconnect, having a connect portion, attached to the device and the interconnect attach portion with the connect portion having an attach width greater than the route width.

18. The system as claimed in claim 16 further comprising:
a device-pathway interconnect, having a connect portion, attached to the device and the interconnect attach portion; and
a further device-pathway interconnect, having a further connect portion, attached to the device and another of the conductive pathway with the further connect portion inline with the connect portion and inside at least one row of the terminal.

19. The system as claimed in claim 16 further comprising a further terminal connected to the device with the further terminal not attached to the conductive pathway and between the device and the terminal.

20. The system as claimed in claim 16 further comprising:
a device-pathway interconnect, having a connect portion, attached to the device and the interconnect attach portion with the connect portion having a spacing substantially the same as the pad pitch; and
a further device-pathway interconnect, having a further connect portion, attached to the device and another of the conductive pathway with the device-pathway interconnect substantially parallel to the further device-pathway interconnect.

* * * * *